United States Patent
Hembree et al.

(10) Patent No.: US 6,392,429 B1
(45) Date of Patent: May 21, 2002

(54) TEMPORARY SEMICONDUCTOR PACKAGE HAVING DENSE ARRAY EXTERNAL CONTACTS

(75) Inventors: David R. Hembree, Boise; Warren M. Farnworth, Nampa; Alan G. Wood; Salman Akram, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/594,748

(22) Filed: Jun. 14, 2000

Related U.S. Application Data

(63) Continuation of application No. 08/949,383, filed on Oct. 14, 1997, now Pat. No. 6,094,058, which is a continuation of application No. 08/584,628, filed on Jan. 11, 1996, now abandoned, which is a continuation-in-part of application No. 08/398,309, filed on Mar. 1, 1995, now Pat. No. 5,519,332, which is a continuation-in-part of application No. 08/345,064, filed on Nov. 14, 1994, now Pat. No. 5,541,525, which is a continuation-in-part of application No. 08/124,899, filed on Sep. 21, 1993, now Pat. No. 5,495,179, which is a continuation-in-part of application No. 08/046,675, filed on Apr. 14, 1993, now Pat. No. 5,367,253, which is a continuation-in-part of application No. 07/973,931, filed on Nov. 10, 1992, now Pat. No. 5,302,891, which is a continuation of application No. 07/709,858, filed on Jun. 4, 1991, now abandoned.

(51) Int. Cl.$^7$ ............................................. G01R 31/02
(52) U.S. Cl. ...................................... 324/755; 324/765
(58) Field of Search ................................ 324/754, 755, 324/758, 765; 439/66, 68

(56) References Cited

U.S. PATENT DOCUMENTS

| | | |
|---|---|---|
| 4,169,642 A | 10/1979 | Mouissie |
| 4,597,617 A | 7/1986 | Enochs |
| 4,783,719 A | 11/1988 | Jamison et al. |
| 4,899,107 A | 2/1990 | Corbett et al. |
| 4,899,921 A | 2/1990 | Bendat et al. |
| 4,937,653 A | 6/1990 | Blonder et al. |
| 5,006,792 A | 4/1991 | Malhi et al. |
| 5,073,117 A | 12/1991 | Malhi et al. |
| 5,081,563 A | 1/1992 | Feng et al. |
| 5,088,190 A | 2/1992 | Malhi et al. |
| 5,123,850 A | 6/1992 | Elder et al. |
| 5,281,151 A | 1/1994 | Arima et al. |
| 5,302,891 A | 4/1994 | Wood et al. |
| 5,367,253 A | 11/1994 | Wood et al. |
| 5,397,245 A | 3/1995 | Roebuck et al. |
| 5,402,077 A * | 3/1995 | Agahdel et al. ............ 324/758 |
| 5,408,190 A | 4/1995 | Wood et al. |
| 5,419,807 A | 5/1995 | Akram et al. |
| 5,440,240 A | 8/1995 | Wood et al. |
| 5,451,165 A | 9/1995 | Cearley-Cabbiness |
| 5,456,404 A | 10/1995 | Robinette, Jr. et al. |

(List continued on next page.)

FOREIGN PATENT DOCUMENTS

JP  Hei 3-69131  8/1989

*Primary Examiner*—Ernest Karlsen
(74) *Attorney, Agent, or Firm*—Stephen A. Gratton

(57) ABSTRACT

A temporary package for a semiconductor die is provided. The temporary package has an outline and external contact configuration that are the same as a conventional plastic or ceramic semiconductor package. The temporary package can be used for burn-in testing of the die using standard equipment. The die can then be removed from the package and certified as a known good die. The package includes a base, an interconnect and a force applying mechanism. The package base includes external contacts formed in a dense array, such as a land grid array (LGA), a pin grid array (PGA), a bumped grid array (BGA) or a perimeter array. The package base can be formed of ceramic or plastic with internal conductive lines using a ceramic lamination process, a 3-D molding process or a Cerdip formation process.

19 Claims, 4 Drawing Sheets

U.S. PATENT DOCUMENTS

| | | |
|---|---|---|
| 5,471,151 A | 11/1995 | DiFrancesco |
| 5,495,179 A | 2/1996 | Wood et al. |
| 5,519,332 A | 5/1996 | Wood et al. |
| 5,541,525 A | 7/1996 | Wood et al. |
| 5,543,725 A | 8/1996 | Lim et al. |
| 5,634,267 A | 6/1997 | Farnworth et al. |
| 5,656,945 A | 8/1997 | Cain |
| 5,691,649 A | 11/1997 | Farnworth et al. |
| 5,739,050 A | 4/1998 | Farnworth |
| 5,783,461 A | 7/1998 | Hembree |
| 5,796,264 A | 8/1998 | Farnworth et al. |
| 5,815,000 A | 9/1998 | Farnworth et al. |
| 5,834,945 A | 11/1998 | Akram et al. |
| 5,844,418 A | 12/1998 | Wood et al. |
| 5,878,485 A | 3/1999 | Wood et al. |
| 5,896,036 A | 4/1999 | Wood et al. |
| 5,929,647 A | 7/1999 | Akram et al. |
| 5,949,242 A | 9/1999 | Wood et al. |
| 5,982,185 A | 11/1999 | Farnworth |
| 6,040,702 A | 3/2000 | Hembree et al. |
| 6,060,893 A | 5/2000 | Farnworth et al. |
| 6,060,894 A | 5/2000 | Hembree et al. |
| 6,091,250 A | 7/2000 | Wood et al. |
| 6,091,251 A | 7/2000 | Wood et al. |
| 6,094,058 A | 7/2000 | Hembree et al. |
| 6,215,322 B1 | 4/2001 | Farnworth et al. |
| 6,222,379 B1 | 4/2001 | Farnworth et al. |
| 6,255,833 B1 | 7/2001 | Akram et al. |
| 6,320,397 B1 | 11/2001 | Wood et al. |

\* cited by examiner

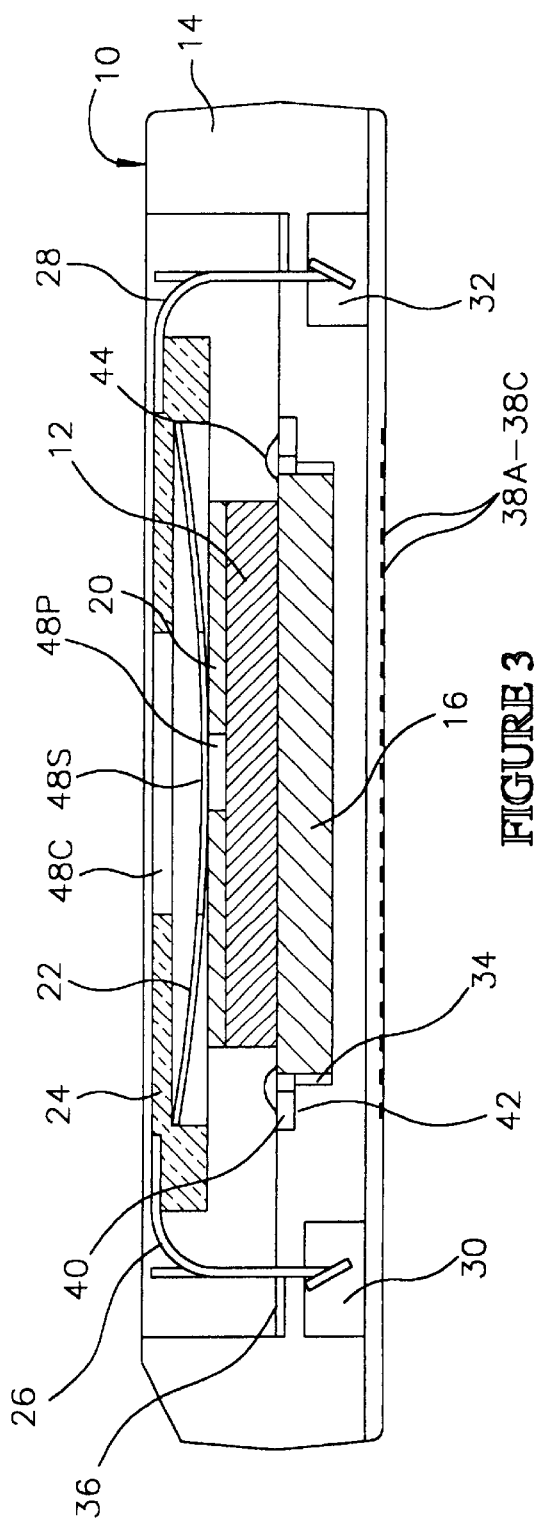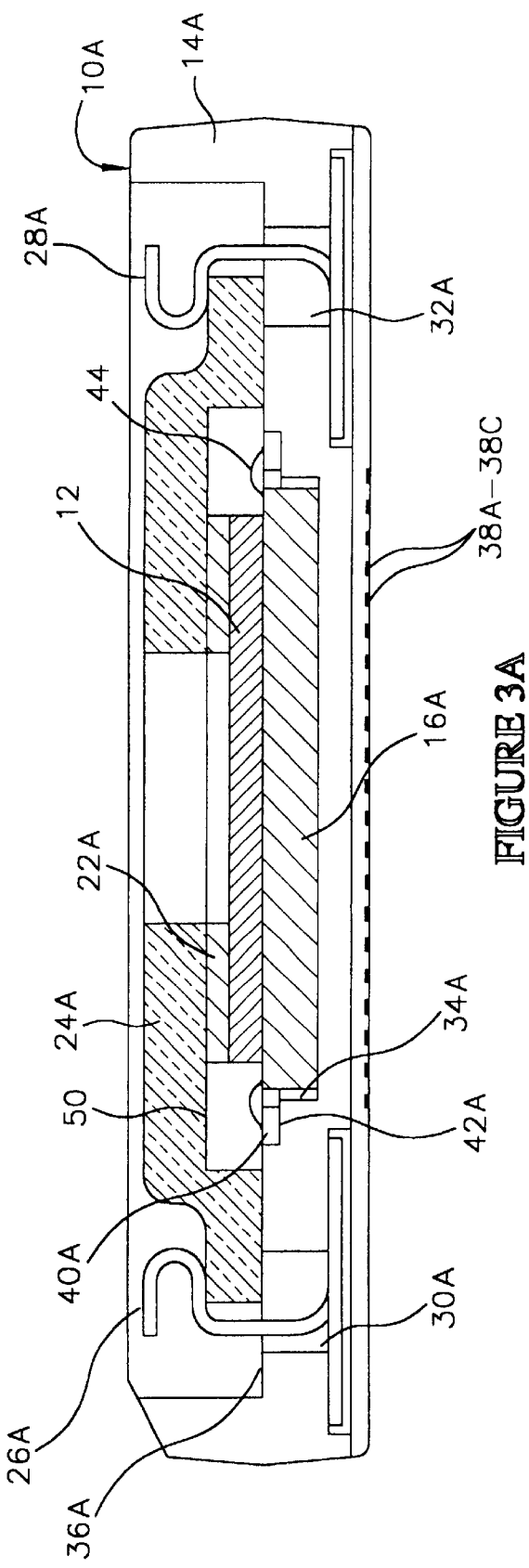
FIGURE 3
FIGURE 3A

TEMPORARY SEMICONDUCTOR PACKAGE HAVING DENSE ARRAY EXTERNAL CONTACTS

Cross Reference to Related Applications

This application is a continuation of application Ser. No. 08/949,383 filed on Oct. 14, 1997, now U.S. Pat. No. 6,094,058, which is a continuation of application Ser. No. 08/584,628 filed Jan. 11, 1998, now abandoned which is a continuation-in-part of application Serial No. 08/398,309 filed Mar. 1, 1995, U.S. Pat. No. 5,519,332, which is a continuation-in-part of application Ser. No. 08/345,064 filed Nov. 14, 1994, U.S. Pat. No. 5,541,525, which is a continuation-in-part of application Ser. No. 08/124,899 filed Sep. 21, 1993, U.S. Pat. No. 5,495,179, which is a continuation-in-part of application Ser. No. 08/046,675, filed Apr. 14, 1993, U.S. Pat. No. 5,367,253, which is a continuation-in-part of application Ser. No. 07/973,931, filed on Nov. 10, 1992, U.S. Pat. No. 5,302,891, which is a continuation of application Ser. No. 07/709,858, filed Jun. 4, 1991, abandoned.

This application is related to application Ser. No. 07/788,065 filed Nov. 5, 1991, Pat. No. 5,440,240 application Ser. No. 07/953,750 filed Sep. 29, 1992, now abandoned; application Ser. No. 08/073,005 filed Jun. 7, 1993, Pat. No. 5,408,190; application Ser. No. 08/073,003 filed Jun. 7, 1993, now abandoned; application Ser. No. 08/120,628 filed Sep. 13, 1993, now abandoned; application Ser. No. 07/896,297 filed Jun. 10, 1992, now U.S. Pat. No. 5,424,652; application Ser. No. 08/192,391 tiled Feb. 3, 1994, U.S. Pat. No. 5,483,174; and application Ser. No. 08/137,675 filed Oct. 14, 1993, now abandoned.

FIELD OF THE INVENTION

This invention relates generally to semiconductor manufacture and more particularly to an improved package for temporarily packaging semiconductor dice for testing and other purposes.

BACKGROUND OF THE INVENTION

Conventionally packaged semiconductor dice are tested several times during the manufacturing process. A probe test is conducted at the wafer level to test the gross functionality of the dice. Following singulation of the wafer and packaging of the individual dice, full functionality and burn-in tests are performed on each of the packaged die. These tests are typically performed using standardized equipment that provides an electrical interface between the external contacts on the package (e.g., terminal leads) and test circuitry.

For example, burn-in ovens are adapted to hold a large number of packaged dice in a chamber with temperature cycling capability. During the burn-in test the integrated circuits are electrically tested at different temperatures. A burn-in board mountable within the chamber, includes electrical connectors that mate with the external leads on the packaged dice to establish an electrical interconnection between the individually packaged dice and test circuitry. For packaged dice having a male external contact, such as external leads formed as pins, the burn-in board may include socket connectors. For packaged dice having female external leads the burn-in board may include pogo pin connectors.

Because semiconductor dice are packaged in standardized configurations, the burn-in boards are also standardized. For example, one common semiconductor package for a single die is known as a small outline j-lead package (SOJ). A burn-in board for SOJ packages will include standardized sockets that mate with the j-leads for the packages. In addition, the spacing for the sockets will be such that a large number of packages can be mounted on a single board in a dense closely spaced array.

In addition to the boards being standardized, there is also associated equipment, such as automated handling apparatus, that is standardized for a particular package configuration. Other standardized packages for a single die include the dual in-line (DIP) package and the zigzag in-line package (ZIP).

Recently, semiconductor dice have been supplied by manufacturers in an unpackaged or bare configuration. A known good die (KGD) is an unpackaged die that has been tested to a quality and reliability level equal to the packaged product. To certify a die as a known good die the unpackaged die must be burn-in tested. This has led to the development of test carriers that hold a single unpackaged die for burn-in and other tests. Each test carrier houses a die for testing and also provides the electrical interconnection between the die and external test circuitry. Exemplary test carriers are disclosed in U.S. Pat. No. 5,302,891 to Wood et al. and U.S. Pat. No. 5,408,190 to Wood et al.

One aspect of these carriers is that they require specialized test equipment, such as specialized burn-in boards and handling equipment, that are different than the equipment used for testing conventionally packaged dice. In addition, the prior art carriers are larger than conventionally packaged dice and therefore require more and larger test equipment to achieve the same throughputs. It would be advantageous to provide a test carrier for semiconductor dice that could be used with standardized test equipment.

Another aspect of the prior art carriers for testing semiconductor dice is that the external contacts for the carriers have a limited pin out capability. Typically, the carriers include external contacts formed as pins that mate with corresponding sockets on the burn-in board. With this type of external contact configuration there may not be enough external contacts to accommodate a die having a large number of closely spaced bond pads. In general, the bond pads on semiconductor dice are becoming smaller and more densely spaced. It would be advantageous to provide a carrier for semiconductor dice having a dense external contact configuration capable of handling dice with large numbers of bond pads.

The present invention recognizes that a carrier can be constructed as a temporary package having a standard outline and external contacts arranged in a dense array. In view of the foregoing, it is an object of the present invention to provide a temporary package for semiconductor dice that can be used for testing and other purposes. It is another object of the present invention to provide a temporary package for semiconductor dice having output contacts arranged in a dense array with a high packing fraction. It is a further object of the present invention to provide a temporary semiconductor package that has a JEDEC standard outline and JEDEC standard external contact configuration. Other objects, advantages and capabilities of the present invention will become more apparent as the description proceeds.

SUMMARY OF THE INVENTION

In accordance with the present invention, an improved temporary package for a semiconductor die is provided. The temporary package has an outline and external lead configuration that matches a conventional semiconductor package. In addition, the external leads are formed in a dense array to accommodate a large number of device bond pads. Suitable dense arrays and lead configurations for the external leads can include: land grid arrays (LGA), pin grid arrays (PGA), ball grid arrays (BGA) and dense perimeter arrays. The standard outline and lead configuration of the temporary package permit standardized burn-in boards and automated package handling equipment to be used during a test procedure foreknown good die.

The temporary package includes a base, an interconnect and a force applying mechanism. The package base includes internal conductors in electrical communication with the external contacts. The package base can be formed of either ceramic or plastic. With ceramic, the package base can be formed using a ceramic lamination process or a ceramic dip formation process (Cerdip). The package base can also be formed of plastic using a 3-D injection molding process or using a ceramic dip formation (Cerdip) process combined with injection molding.

The interconnect for the package is mounted to the base and wire bonded to the conductors formed on the package base. The interconnect can be formed of silicon with raised contact members that contact and establish electrical communication with the bond pads on the die. The interconnect can also be formed with microbump contact members mounted on a plastic film similar to two layer TAB tape.

The force applying mechanism for the package includes a pressure plate, a spring and a cover. The force applying mechanism functions to secure the die within the base and to maintain the die and interconnect in electrical contact. The force applying mechanism is secured to the base with a latching mechanism.

The package is assembled by optically aligning the die and the interconnect. Prior to the alignment procedure the interconnect is mounted within the package base and wire bonded to form an electrical path between the contact members on the interconnect and the external contacts on the package base. During the alignment procedure, the die and force applying mechanism of the package can be held by an assembly tool. Flip chip optical alignment can be used to align the bond pads on the die to the contact members on the interconnect. The assembly tool then places the die on the interconnect and attaches the force applying mechanism to the package base.

BRIEF DESCRIPTION OF THE DRAWINGS

FIG. 3 is a cross sectional view of the assembled package;

FIGS. 3A is a cross sectional view equivalent to FIG. 3 showing an alternate embodiment package;

Detailed Description of the Preferred Embodiments

Figure 1:
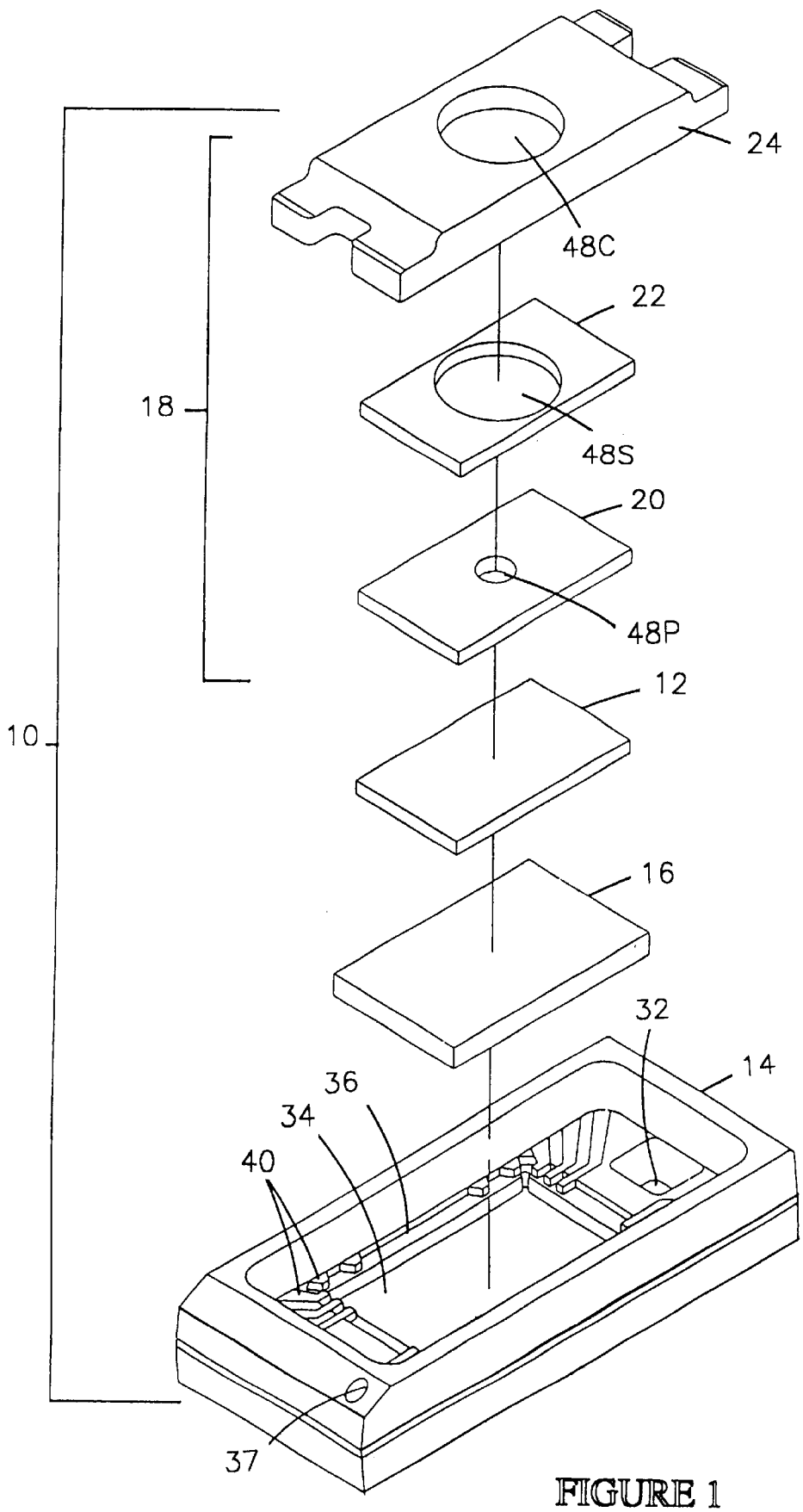
FIG. 1 is an exploded perspective view of a package constructed in accordance with the invention.

Referring to FIG. 1, an exploded perspective view of a temporary package 10 constructed in accordance with the invention is shown. The package 10 is adapted to hold a semiconductor die 12 and to establish a temporary electrical connection with the die 12 for testing and burn-in. Following the test procedure the die 12 can be removed from the package 10 and used as a known good die.

The package 10, generally stated, includes a package base 14, an interconnect 16, and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 3) which secure the force applying mechanism 18 to the package base 14.

The package base 14 includes a pattern of internal conductors 40 that are in electrical communication with external contacts 38A–38C (FIG. 2) formed on a bottom surface 31 (FIG. 2) of the package base 14. As will be further explained, the conductors 40 are wire bonded to the interconnect 16 to provide an electrical path between the die 12 and the external contacts 38A–38C. The package base 14 also includes an indicator pocket 37 (FIG. 1) that can be used to indicate the orientation of the external contacts 38A–38C with respect to the die 12 (i.e., pin #1 indicator).

As shown in FIG. 3, in the assembled package 10, the die 12 is held within a recess 36 formed within the package base 14 and is sandwiched between the interconnect 16 and the cover 24. The interconnect 16 is also mounted within a recess 34 formed within the package base 14. As also shown in FIG. 3, in the assembled package 10, the pressure plate 20 overlies the die 12, and the spring 22 presses the pressure plate 20 and the die 12 against the interconnect 16.

Still referring to FIG. 3, the clips 26, 28 attach to corresponding openings 30, 32 in the base 14 to secure the cover 24, spring 22, pressure plate 20, and die 12 to the package base 14. The clips 26, 28 can be formed of a flexible material such as spring steel, or plastic, and are shaped to exert a retention force on the cover 24. Furthermore, in the assembled package 10, the cover 24 is recessed below the top surface of the package base 14. The outer peripheral size and outline of the package 10 are thus substantially determined by the outer peripheral size and outline of the package base 14.

Still referring to FIG. 3, the cover 24, spring 22 and pressure plate 20, all include a central opening which are designated 48C, 48S and 48P respectively. As will be further explained, the openings 48C, 48S and 48P are used during assembly and disassembly of the package 10. Specifically, the openings 48C, 48S and 48P permit the die 12 to be held by a vacuum tool (not shown) during optical alignment of the die 12 and interconnect 16 during assembly of the package 10. In a similar manner, a vacuum tool (not shown) can be used to disassemble the package 10.

The package 10 has a standard outline that is substantially equivalent to a conventional semiconductor package. In addition, the external contacts 38A–38C are formed with a standard size and spacing that are substantially equivalent to a conventional semiconductor package. As used herein, the term conventional semiconductor package refers to a plastic or ceramic package having an outline and external lead configuration that conforms to standards of a recognized industry standard setting body. These standard setting bodies can include:

EIA/JEDEC—Electronics Industry Association—Joint Electron Device Engineering Council JEIDA—Japanese Electronics Industry Development Association PCMCIA—Personal Computer Memory Card International Association The standard outline and lead configuration permit the package 10 to be used with standardized burn-in equipment for a conventional package. By way of example, the standardized equipment can include an AMBYX$_{TM}$intelligent burn-in and test system manufactured by Micron Systems Integration, Inc.

Figure 2:
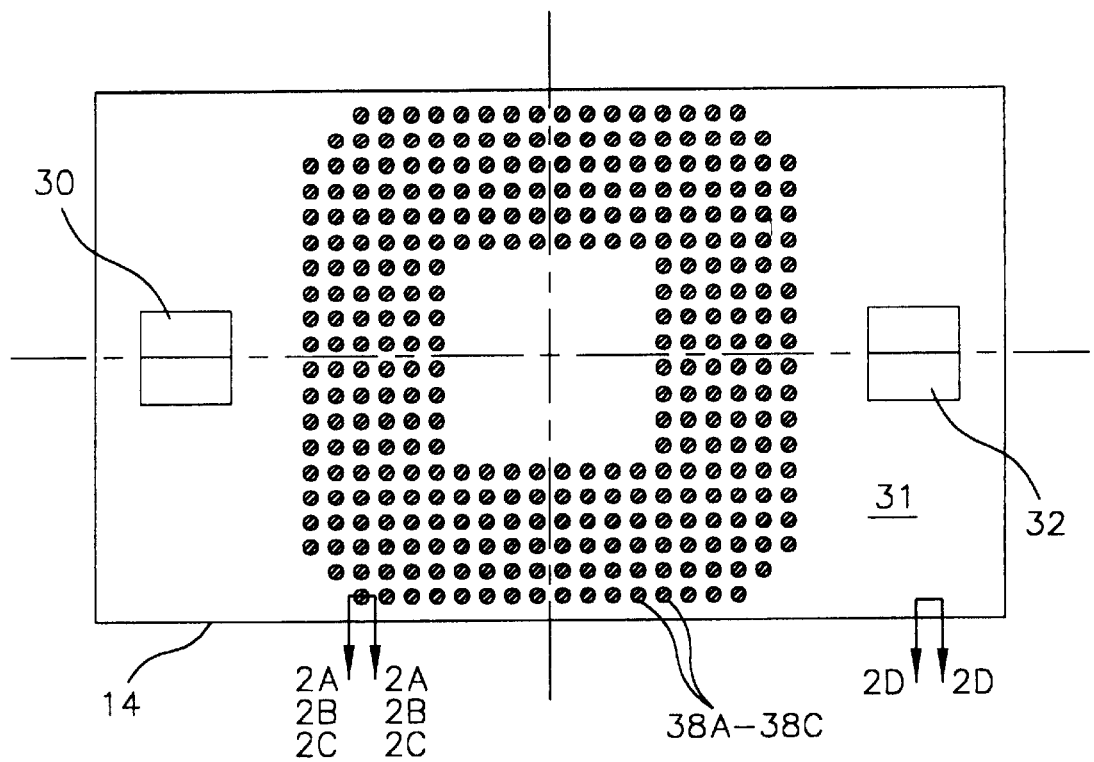
FIG. 2 is a bottom view of the package base showing the external contacts formed in a dense grid array.
Figure 2A:
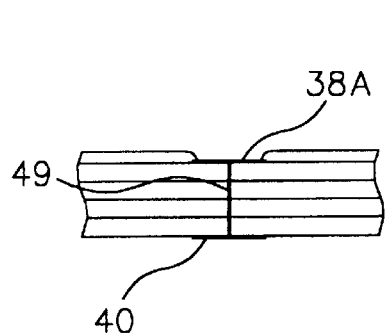
FIG. 2A is a cross sectional view taken along section line 2A—2A of FIG. 2 showing external contacts formed as flat pads in a land grid array (LGA)
Figure 2B:
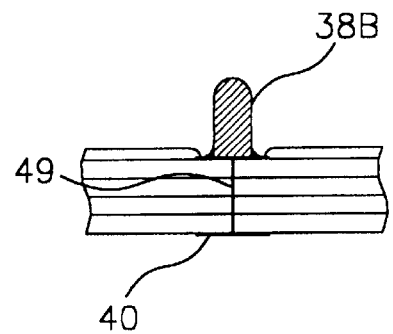
FIG. 2B is a cross sectional view taken along section line 2B—2B of FIG. 2 showing external contacts formed as pins in a pin grid array (PGA)
Figure 2C:
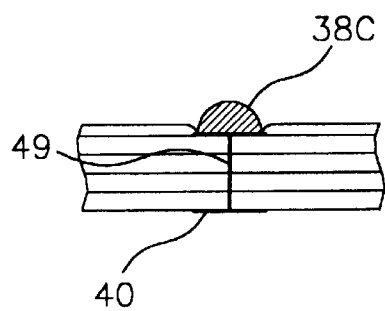
FIG. 2C is a cross sectional view taken along section line 2C—2C of FIG. 2 showing external contacts formed as bumps in a bumped grid array (BGA)

Referring to FIG. 2, the external contacts 38A–38C for the package 10 are formed in a dense grid pattern on a bottom surface 31 of the base 14. As shown in FIG. 2A, the external contacts 38A can be in the form of land pads arranged in a land grid array (LGA). Alternately, as shown in FIG. 2B, the external contacts 38B can be in the form of pins arranged in a pin grid array (PGA). Alternately, as shown in FIG. 2C, the external contacts 38C can be in the form of bumps arranged in a ball, grid array (BGA). The external contacts 38A–38C can also be arranged in a dense perimeter pattern (not shown) rather than a grid pattern.

In each of these cases the external contacts 38A–38C are in electrical communication with internal conductive lines 49 formed integrally with the package base 14. The internal conductive lines 49 are in electrical communication with the conductors 40 formed on the package base 14. As shown in FIG. 3, the conductors 40 terminate at a bond shelf 42 and are wire bonded to the interconnect 16 using bond wires 44.

Referring to FIG. 2A, the external contacts 38A in a land grid array can be formed as flat land pads out of a suitable metal or stack of metals. Exemplary metals can include gold, copper, silver, tungsten, tantalum, platinum, palladium and molybdenum or alloys of these metals. An exemplary stack can include a gold layer with nickel underplating. Other exemplary stacks can include other combinations of the above metals. A metallization process such as plating can be used to form the external contacts 38A as flat land pads. Such a plating process can include electrolytic or electroless deposition of a metal layer followed by resist coating, exposure, development, and selective wet chemical etching. Typically, the exposed surface of the external contacts 38A will be an electroplated metal such as gold.

By way of example, a diameter of the external contacts 38A can be from about 50 µm to 500 µm. A center line to center line spacing of the external contacts 38A can be from about 50 µm to 500 µm. A representative thickness for the external contacts 38A can be from 1.25 m to 100 µm. The external contacts 38A are adapted to be contacted by a mating electrical connector on a burn-in board such as a pogo pin, solder ball, or other connector in electrical communication with external test circuitry.

As shown in FIG. 2B, the external contacts 38B can be formed using the same process as outlined above for external contacts 38A, but with a pin brazed or soldered to the flat land pads. As shown in FIG. 2C, the external contacts 38C can be formed using the same process as outlined above for external contacts 38A, but with a solder paste screen printed onto the flat land pads, heated and then reflowed into a ball.

As used herein the term "dense grid pattern" refers to a contact pattern in which the density of the contacts 38A–38C is high in relation to the total area occupied by the contacts. This relationship is sometimes expressed as a "packing fraction". In general, the packing fraction of a pattern of contacts is the area occupied by the contacts over the total area available. For example, contacts formed in a grid pattern of one hundred and forty four one inch square blocks in an area twelve inches by twelve inches would yield a packing fraction of one. A pattern of one hundred and forty four one inch diameter round contacts in a grid of one hundred forty four one inch squares would yield a packing fraction of 0.7854. In actual practice packing fractions close to one are not possible because some spacing is required between the contacts in order to minimize shorting between adjacent contacts. For example, contacts formed as bumps (e.g., 38C—FIG. 2C) require some spacing to prevent shorting during reflow. In general, a "dense grid pattern" will have a packing fraction of 0.25 or greater.

Figure 2D:
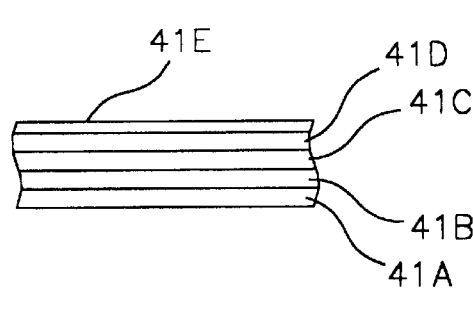
FIG. 2D is a cross sectional view taken along section line 2D—2D of FIG. 2 showing the laminated ceramic layers of the base for the package.

As shown in FIG. 2D, the package base 14 can be a multi layer block formed of fired laminated ceramic layers 41A–41E such as alumina ($Al_2O_3$). Such a process is described in U.S. Pat. No. 5,519,332 which is incorporated herein by reference. Briefly, this process involves forming metallized circuits in the x, y and z planes. These circuits are formed on green sheets of ceramic using a suitable metallization process and are interconnected with metal filled vias. The green sheets are then pressed together and sintered at high temperatures to form a unitary structure. Using this process the conductors 40 and external contacts 38A–38C can be formed using suitable metals and then interconnected by forming internal conductive lines 49. In addition, as shown in FIGS. 2A–2C, the external contacts 38A–38C can be recessed below the outermost ceramic layer 41E.

The package base 14 can also be formed using a 3-D injection molding process out of a high temperature glass filled plastic such as a FR-4 material. Such a process is described in U.S. Pat. No. 4,985,116 and in the above incorporated U.S. Pat. No. 5,519,332. Suitable plastics include polyetherimide (PEI), polyethersulfone (PES), polyarylsulfone (PAS), polyphenylene sulfide (PPS), liquid crystal polymer (LCP) and polyether-ether ketone (PPEK). An injection molding process with these or other suitable material can be used to form the package base 14 into the desired rectangular shape and with cavities as required. During a subsequent metallization process, various circuit patterns including the conductors 40 and external contacts 38A–38C can be formed on the package base 14 and can be interconnected by forming the internal conductive lines 49.

The package base 14 can also be formed using a ceramic dip formation process (Cerdip). In general, with a Cerdip process a mixture of alumina lubricants and binders can be molded and sintered to form the monolithic package base 14. A metal lead frame can then be bonded to the package base 14 using low temperature glasses to form the conductors 40. The external contacts 38A–38C can be part of the lead frame or can be formed separately. Another type of ceramic dip formation process uses a plastic rather than a ceramic body. Briefly, this Cerdip formation process pre-molds a plastic base which is then bonded to a leadframe. Conventional semiconductor packages formed using this process are sold by GTE Products Corporation, Warren, Pennsylvania under the trademark QUAD-PACK™.

FIG. 3A illustrates an alternate embodiment package 10A. The alternate embodiment package 10A includes substantially the same elements as previously explained for package 10 which are denoted with an "A" suffix. However, in the alternate embodiment package 10A, the spring 22A is formed as a flat member and the pressure plate 20 (FIG. 3) is eliminated. By way of example, the spring 22A can be a flat metal spring (e.g., wave spring) or can be formed of a resilient elastomeric material such as a silicone elastomer or polyimide material.

In addition, in the alternate embodiment package 10A, the cover 24A includes a recess 50 which encloses the spring 22A and die 12. The cover 24A abuts a bottom surface of the recess 36A in the package base 14A and is retained by a pair of sliding clips 26A, 28A. The sliding clips 26A, 28A are slidably mounted to the base 14A and are formed in an S-shape to exert a retention force on the cover 24A.

Figure 4:
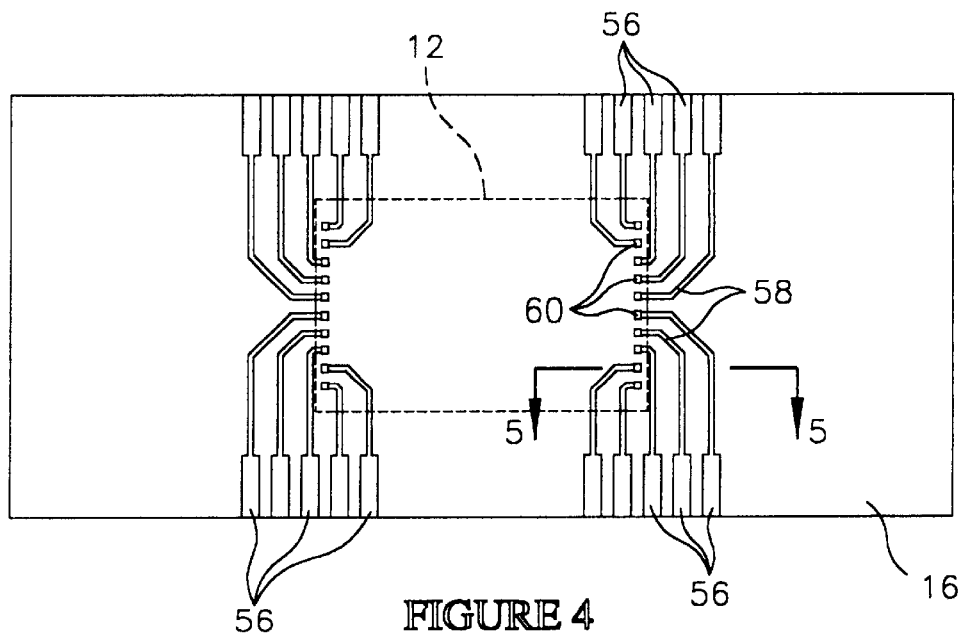
FIG. 4 is a plan view of the interconnect for the package shown in FIG. 1.
Figure 5:
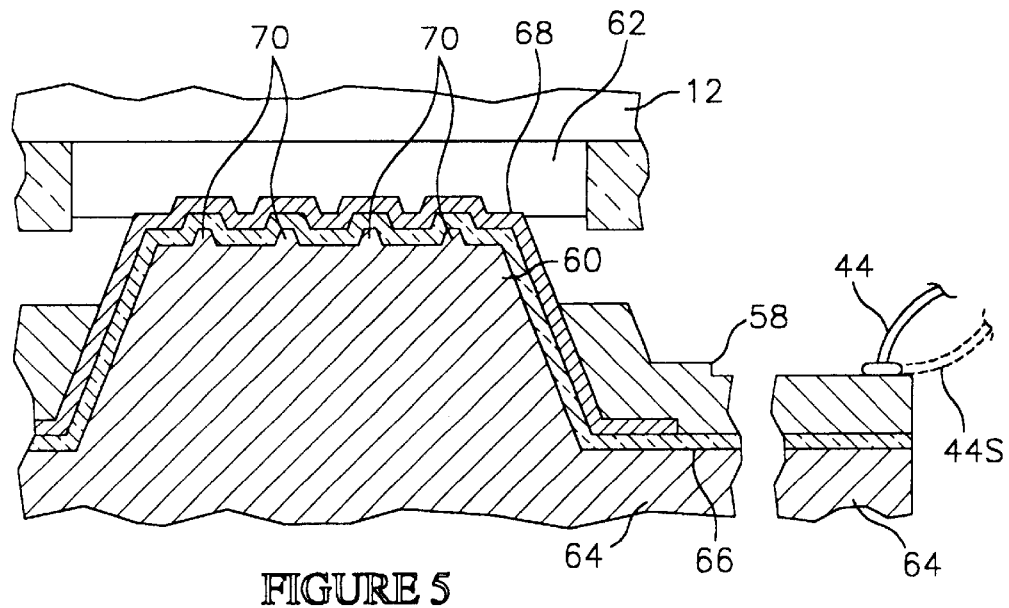
FIG. 5 is a cross sectional view taken along section line 5—5 of FIG. 4 showing a raised contact member on the interconnect electrically contacting a device bond pad on the die.

Referring to FIG. 4, the interconnect 16 for the package 10 is shown separately. The interconnect 16 includes bonding pads 56 that are wire bonded to the conductors 40 formed in the package base 14. The interconnect 16 also includes conductive traces 58 and raised contact members 60. As shown in FIG. 5, the raised contact members 60 are adapted to contact and establishaan electrical connection with the device bond pads 62 or other contact locations on the die 12. In addition, the raised contact members 60 include penetrating projections 70 formed as elongated blades adapted to penetrate the device bond pads 62 to a self limiting penetration depth.

The interconnect 16 and raised contact members 60 can be formed by etching a silicon substrate 64. An insulating layer 66 and a conductive layer 68 formed on the substrate 64 overlie the raised contact members 60. The conductive layer 68 is in electrical communication with the conductive traces 58 which are wire bonded to bond wires 44. Alternately, in place of wire bonding, an electrical connection can be formed to the conductive traces 58 with slide contacts 44S.

A suitable process for forming the contact members 60 substantially as shown is disclosed in U.S. Pat. No. 5,326, 428 and U.S. Pat. No. 5,419,807 which are incorporated herein by reference. Another suitable process is disclosed in U.S. Pat. No. 5,634,267, incorporated herein by reference.

Figure 5A:
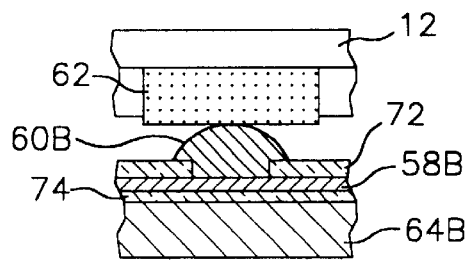
FIG. 5A is a cross sectional view equivalent to FIG. 5 of an alternate embodiment interconnect having a microbump contact member.

With reference FIG. 5A, the interconnect 16 can also be formed with microbump contact members 60B and conductive traces 58B formed on a plastic film 72. The microbump contact members 60B and plastic film 72 can be similar to two layer TAB tape such as ASMAT manufactured by Nitto Denko. The plastic film 72 can be mounted to a substrate 64B such as silicon using a compliant adhesive layer 74. The compliant adhesive layer can be formed of a silicone elastomer, an epoxy or a polyimide material. One method for forming an interconnect with microbump contact members is described in previously cited U.S. Pat. No. 5,634,267.

Referring again to FIG. 1, the package 10 can be assembled using optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

In the present case, an aligner bonder may be modified to provide an assembly apparatus for use in assembling the package 10. The assembly apparatus includes an assembly tool (not shown) that is adapted to retain the force applying mechanism 18 (FIG. 1), die 12 and clips 26, 28 (FIG. 3). The components of the force applying mechanism 18 include openings 48C, 48S, 48P which allow a vacuum wand (not shown) of the assembly tool to hold the die 12. With the die 12 held by the assembly tool, the bond pads 62 (FIG. 5) on the die 12 are aligned with the contact members 60 (FIG. 5) on the interconnect 16. The assembly tool then places the die 12 in contact with the interconnect 16 and secures the clips 26, 28 (FIG. 3) to the openings 30, 32 in the package base 14.

U.S. Pat. No. 5,634,367, filed Nov. 14, 1994, incorporated herein by reference, describes an automated apparatus suitable for optically aligning the die 12 and interconnect 16 and securing the force applying mechanism 18 to the package base 14.

Following the assembly procedure the package 10 can be used to test the die 16. Testing can include full functionality as well as burn-in testing. Following the test procedure, the package 10 can be disassembled using an assembly tool (not shown) to remove the clips 26, 28 and force distribution mechanism 18 substantially as previously described for the assembly procedure.

While the invention has been described with reference to certain preferred embodiments, as will be apparent to those skilled in the art, certain changes and modifications can be made without departing from the scope of the invention as defined by the following claims.

What is claimed is:

1. A temporary package for testing a semiconductor die comprising:
    a base for retaining the die comprising a plurality of conductors and a plurality of external contacts on a surface thereof in electrical communication with the conductors, the base in a configuration of a grid array semiconductor package to permit the temporary package to be used with test equipment for the semiconductor package and to permit the die to be tested using the test equipment, the external contacts having a packing fraction comprising a first area occupied by the external contacts divided by a second area of the surface, of at least 0.25; and
    an interconnect on the base comprising a plurality of contact members in electrical communication with the conductors and configured to electrically contact a plurality of contact locations on the die.

2. The temporary package of claim 1 wherein the contact locations comprise bond pads and the contact members comprise projections configured to penetrate the bond pads.

3. The temporary package of claim 1 wherein the external contacts comprise pins in a pin grid array.

4. The temporary package of claim 1 wherein the external contacts comprise land pads in a land grid array.

5. The temporary package of claim 1 wherein the external contacts comprise bumps or balls in a ball grid array.

6. The temporary package of claim 1 further comprising a cover and a spring configured to bias the die against the interconnect.

7. The temporary package of claim 1 wherein the base comprises a material selected from the group consisting of plastic and ceramic.

8. A temporary package for testing a semiconductor die, comprising:
    a base for retaining the die having a surface and comprising a plurality of external contacts on the surface in a grid array having a packing fraction of at least 0.25, the packing fraction comprising a first area occupied by the external contacts divided by a second area of the surface, the base and the external contacts having a configuration of a grid array semiconductor package to permit the temporary package to be used with test equipment for the semiconductor package;

an interconnect on the base comprising a plurality of contact members configured to electrically contact a plurality of contact locations on the die; and a plurality of electrical paths on the base between the contact members and the ball contacts.

9. The temporary package of claim 8 wherein the external contacts comprise pads and the grid array comprises a land grid array.

10. The temporary package of claim 8 wherein the external contacts comprise pins and the grid array comprises a pin grid array.

11. The temporary package of claim 8 wherein the external contacts comprise bumps or balls and the grid array comprises a ball grid array.

12. The temporary package of claim 8 wherein the contact locations comprise bond pads and the contact members comprise projections configured to penetrate the bond pads.

13. A temporary package for testing a semiconductor die, comprising:

a base for retaining the die having a surface and comprising a plurality of conductors and a plurality of external contacts in electrical communication with the conductors arranged on the surface in a grid array having a packing fraction of at least 0.25, the packing fraction comprising a first area occupied by the external contacts divided by a second area of the surface, the base and the external contacts in a configuration equivalent to a grid array semiconductor package to permit the temporary package to be used with test equipment for the semiconductor package;

an interconnect on the base comprising a plurality of contact members configured to electrically contact a plurality of contact locations on the die; and a plurality of conductive paths between the contact members on the interconnect and the conductors on the base.

14. The temporary package of claim 13 wherein the external contacts comprise pads and the grid array comprises a land grid array.

15. The temporary package of claim 13 wherein the external contacts comprise pins and the grid array comprises a pin grid array.

16. The temporary package of claim 13 wherein the external contacts comprise bumps or balls and the grid array comprises a ball grid array.

17. The temporary package of claim 13 further comprising a spring member on the base configured to bias the die against the interconnect.

18. The temporary package of claim 13 further comprising a cover attached to the base and at least one clip member slidably mounted to the base attaching the cover to the base.

19. The temporary package of claim 13 wherein the contact locations comprise bond pads and the contact members comprise projections configured to penetrate the bond pads.

* * * * *